United States Patent

Hirtz et al.

Patent Number: 5,272,106
Date of Patent: Dec. 21, 1993

[54] METHOD FOR THE MAKING OF AN OPTOELECTRONIC DEVICE

[75] Inventors: Jean-Pierre Hirtz, L'Haye les Roses; Jean-Charles Garcia, Athis-Mons; Philippe Maurel, Sevres, all of France

[73] Assignee: Thomson-CSF, Puteaux, France

[21] Appl. No.: 905,317

[22] Filed: Jun. 29, 1992

[30] Foreign Application Priority Data

Jul. 5, 1991 [FR] France ............ 91 08452

[51] Int. Cl.$^5$ ............ H01L 21/20
[52] U.S. Cl. ............ 437/89; 437/126; 437/944; 437/948; 437/129; 118/719
[58] Field of Search ............ 437/89, 126, 105, 107, 437/944, 948, 129; 118/719; 148/DIG. 100

[56] References Cited

U.S. PATENT DOCUMENTS

| | | |
|---|---|---|
| 3,616,527 | 11/1971 | Janning ............ 437/948 |
| 4,592,306 | 6/1986 | Gallego . |
| 4,944,246 | 7/1990 | Tanaka et al. . |
| 5,011,366 | 4/1991 | Miller . |
| 5,059,552 | 10/1991 | Harder et al. . |
| 5,067,218 | 11/1991 | Williams . |
| 5,076,205 | 12/1991 | Vowles et al. . |

OTHER PUBLICATIONS

Applied Physics Letters, vol. 56, No. 11, Mar. 12, 1990, New York, US, pp. 1014-1016; H. P. Lee, et al.: "Double-Heterostructure GaAs/AlGaAs Lasers on Si Substrates With Reduced Threshold Current and Built-In Index Guiding by Selective-Area Molecular Beam Epitaxy".

Applied Physics Letters, vol. 31, No. 4, Aug. 15, 1977, New York, US, pp. 301-304; W. T. Tsang, et al.: "Selective Area Growth of GaAs/Al$_x$Ga$_{1-x}$As Multilayer Structures with Molecular Beam Epitaxy Using Si Shadow Masks".

Primary Examiner—Olik Chaudhuri
Assistant Examiner—Ramamohan R. Paladugu
Attorney, Agent, or Firm—Oblon, Spivak, McClelland, Maier & Neustadt

[57] ABSTRACT

Disclosed is a method for the making of an optoelectronic device such as buried lasers in which the different layers of the device are chiefly made during a single step of epitaxy by means of a removable mechanical mask.

4 Claims, 2 Drawing Sheets

_(5,272,106)_

METHOD FOR THE MAKING OF AN OPTOELECTRONIC DEVICE

BACKGROUND OF THE INVENTION

The invention relates to a method for the making of an optoelectronic device such as a laser diode or a photodetector and, more particularly, a device in ridge form.

The methods generally used to make diodes and arrays of laser diodes suffer the drawback of a cumbersome technology that comprises a large number of elementary steps. For example, the ridge structure commonly used and shown schematically in FIG. 1 calls for:
  two epitaxy steps;
  one lithography/etching step;
  one ion or proton implantation step.

The techniques of epitaxy in ultra-vacuum such as those of the molecular beam epitaxy (MBE) or chemical beam epitaxy (CBE) type are opening up new possibilities in terms of selective epitaxy. The molecular nature of the fluxes in MBE and CBE offer the possibility of selective growth through a mechanical mask placed on the substrate. Moreover, it is only these techniques that enable the growth of semi-insulator III-V materials such as, for example, GaAlAs, InP or GaInP.

For example, the article by W. T. TSANG et al, "Selective Area Growth of GaAs/$Al_xGa_{1-x}As$ Multilayer Structures With Molecular Beam Epitaxy Using Si Shadow Masks" in _Applied Physics Letters_, Vol. 31, No. 4, Aug. 15, 1977 describes a method of epitaxy through a mechanical mask. However, no method for the manufacture of optoelectronic devices uses this technique which, all the same, is a known one.

The invention relates to a method for the making of ridge type optoelectronic devices that comprises a reduced number of manufacturing steps. In particular, this method has the advantage of requiring only one epitaxial step.

SUMMARY OF THE INVENTION

The invention therefore relates to a method for the making of an optoelectronic device, wherein said method comprises the following steps:
  a step for the positioning, in an epitaxy chamber, of a mask above a substrate to be subjected to epitaxy;
  a first step for the epitaxy, on the substrate, through the mask, of different constituent layers of the optoelectronic device;
    a first optical confinement layer;
    active layers;
    a second optical confinement layer;
    a contact layer;
    a masking layer;
  a step for the removal of the mask without opening the epitaxy chamber;
  a second step for the epitaxy of an optical and electrical confinement layer;
  a step for the removal of the masking layer and of the material of the optical and electrical confinement layer, revealing the contact layer.

BRIEF DESCRIPTION OF THE DRAWINGS

The different objects and features of the invention shall appear more clearly in the following description given by way of an example and from the appended figures, of which.

DETAILED DESCRIPTION OF THE INVENTION

Figure 1:
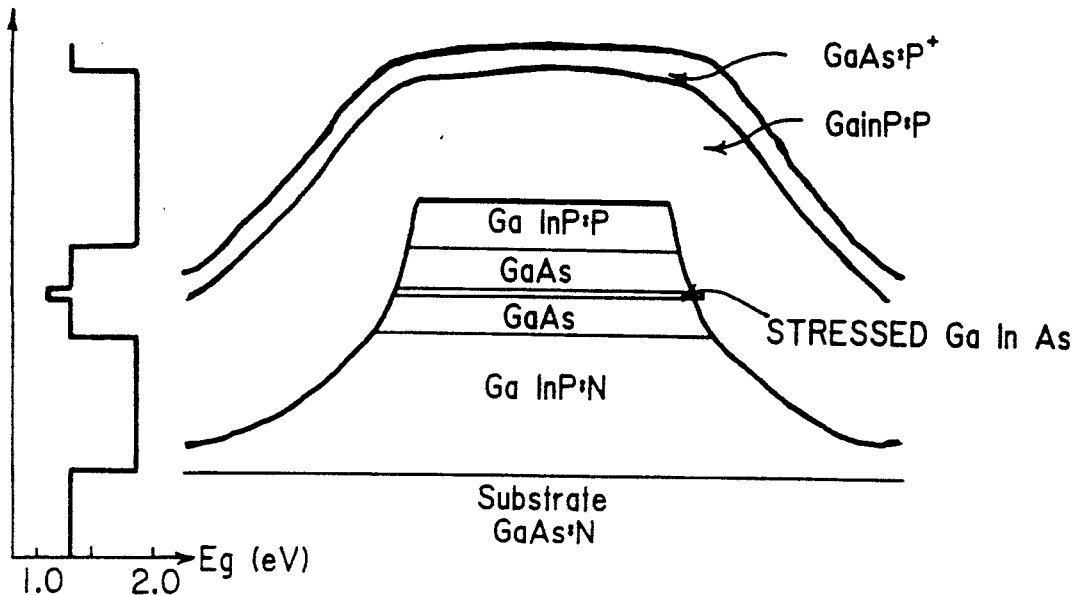
FIG. 1 shows a device in ridge form, known in the prior art and described here above.
Figure 2:
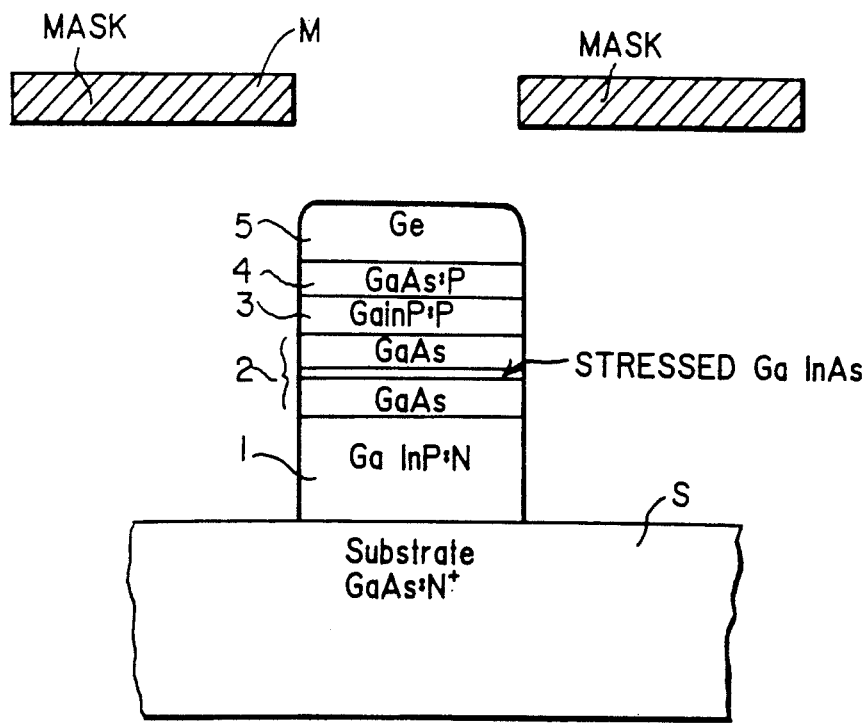
FIGS. 2, 3 and 4 show different steps for carrying out the method of the invention.
Figure 3:
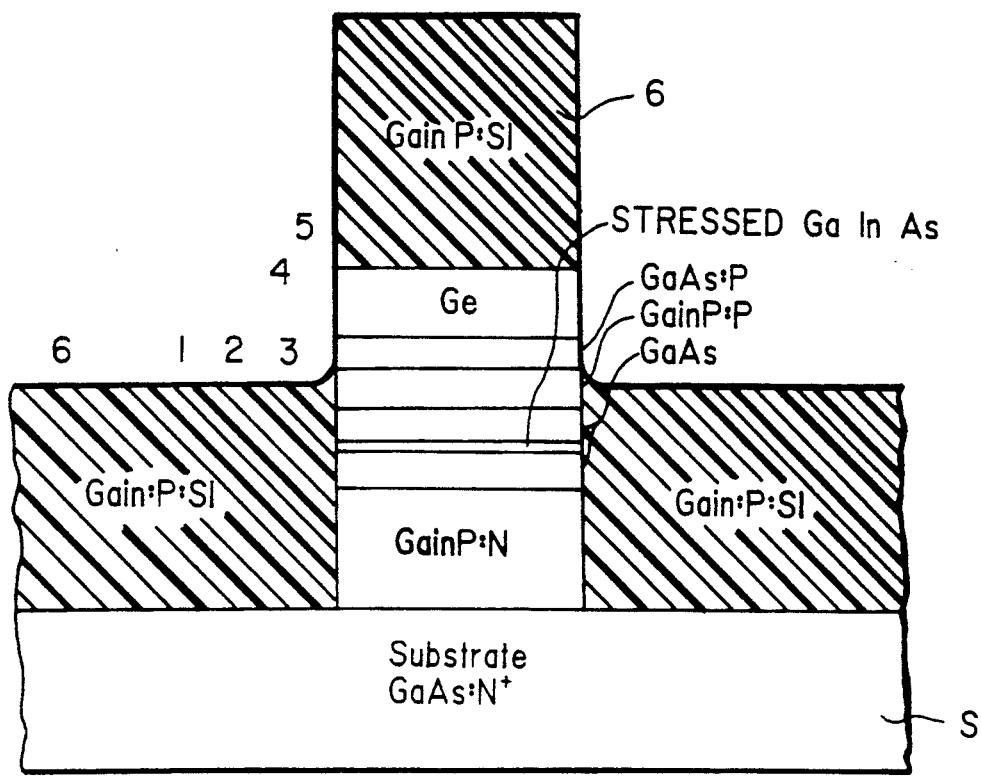
Figure 4:
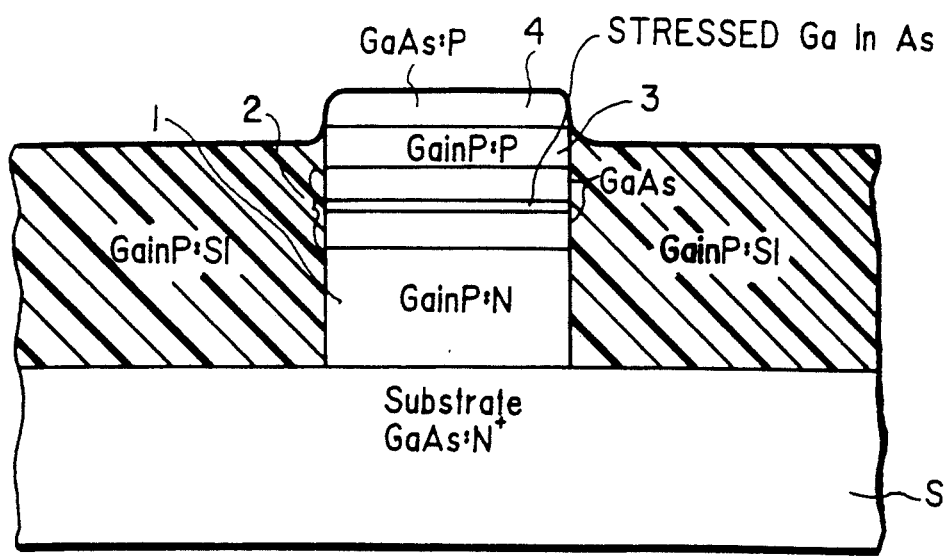

Referring to FIGS. 2 to 4, a description shall therefore be given of a method, according to the invention, for making an optoelectronic device.

A substrate S is placed in an epitaxy chamber and a mask M is placed above the face of the substrate S to be subjected to epitaxy. This mask is close to the substrate or adjoins it. The different successive layers of the component to be obtained are then epitaxially grown through the same mask M (FIG. 2). For example, a laser type optoelectronic component will be obtained by the epitaxial growth:
  a first confinement layer 1;
  one or more active layers of the laser 2;
  a second confinement layer 3;
  a contact layer 4;
  a masking layer 5.

The mechanical mask M is then removed from the surface of the substrate without in any way thereby opening the epitaxy chamber. Then, a layer 6 of a confinement material is epitaxially grown as shown in FIG. 3.

This layer 6 covers the substrate S on each side of the structure 1, 2, 3, 4, 5 so as to optically and electrically confine the active layer 2 at least laterally. The layer 6 also covers the upper part of the layer 5.

Finally, as shown in FIG. 4, the layer 6 is etched during the selective etching of the layer 5.

The epitaxy, through the mask M, of the layers 1 to 5 can be done by any method of growth using molecular beams such as MBE (molecular beam epitaxy) or CBE (chemical beam epitaxy). The epitaxy of the layer 6 can be done by the same method. In this way, the device can be made by on-site epitaxy, i.e. without taking the device out during the performance of the method and without opening the epitaxy chamber.

This method for the making of laser arrays enables the making, in one technological step (MBE or CBE growth), of the laser and of the laser arrays based on heterostructures of III-V materials such as, for example, GaAlAs/GaAs (0.7–0.9 $\mu$m), GaInAsP/InP (1.2–1.5 $\mu$m), GaInP/GaInAs (0.9–1.1 $\mu$m).

By way of an indication, this method can be implemented by providing for a distance between evaporation cells and substrate of 12 cm for example (5 to 20 cm) and a mask/substrate distance of 1 mm (about 0 mm to 2 mm). With a mask-substrate distance of 1 mm, edge effects are generated on a typical width of 40 mm in a molecular beam configuration perpendicular to the surface of the mask, which is acceptable for a device with a width of 1 $\mu$m for example.

It is clear that the above description has been given purely by way of an example. Other variants may be considered without going beyond the scope of the invention. The numerical examples and the examples of materials have been given only to illustrate the description. The essential feature of the invention lies in the fact that the structure is made entirely in the ultra-vacuum environment of the epitaxy system without any exposure, to air, of the structures and without any intermediate etching or ion implanting operation.

The invention is more particularly applicable to the making of a B. R. S. (buried ridge structure) type laser or to the making of arrays of lasers. The active layer 2 may be made in the same epitaxy step in the form of a stack of layers constituting a quantum well as shown in FIGS. 2 to 4.

What is claimed is:

1. A method for making an optoelectronic device, comprising the steps of:
   (a) positioning a substrate and a mask in an epitaxy chamber so that the mask is above a surface of the substrate;
   (b) epitaxially growing on the substrate by sequentially depositing through the mask a first optical confinement layer, an active layer, a second optical confinement layer, a contact layer, and a masking layer;
   (c) removing the mask from above the substrate;
   (d) epitaxially growing on the surface of the substrate an optical and electrical confinement layer which laterally encloses all sides of the active layers; and
   (e) selectively etching away the masking layer thereby removing the masking layer and the optical and electrical confinement layer from a region directly above the contact layer thereby exposing the contact layer.

2. A method according to claim 1, wherein the epitaxial growing steps (b) and (d) comprise one of molecular beam epitaxy and chemical beam epitaxy.

3. A method according to claim 1, wherein a distance between the substrate and the mask when the mask is positioned above the substrate is between 0 and 2 mm.

4. A method for making an electronic device, comprising the steps of:
   positioning a substrate and a mask in an epitaxy chamber so that the mask is above a surface of the substrate;
   epitaxially growing on the substrate by sequentially depositing through the mask onto an exposed region of the surface of the substrate a first layer and a masking layer;
   removing the mask from above the substrate; then
   epitaxially growing on the substrate a second layer which is thinner than the first layer so that lateral edges of the masking layer are not covered by the second layer;
   selectively etching away the masking layer, thereby exposing an upper surface of the first layer that is directly above said exposed region.

* * * * *